(12) United States Patent
Tseng

(10) Patent No.: US 6,498,064 B2
(45) Date of Patent: Dec. 24, 2002

(54) FLASH MEMORY WITH CONFORMAL FLOATING GATE AND THE METHOD OF MAKING THE SAME

(75) Inventor: Horng-Huei Tseng, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 09/855,941

(22) Filed: May 14, 2001

(65) Prior Publication Data

US 2002/0168819 A1 Nov. 14, 2002

(51) Int. Cl.⁷ ............................................. H01L 21/8247

(52) U.S. Cl. ....................................... 438/257; 438/296

(58) Field of Search ................................. 438/257–267, 438/296

(56) References Cited

U.S. PATENT DOCUMENTS 5,599,727 A * 2/1997 Hakozaki et al.
2001/0002714 A1 * 6/2001 Doan

* cited by examiner

Primary Examiner—Richard Booth
(74) Attorney, Agent, or Firm—Blakely Sokoloff Taylor & Zafman LLP

(57) ABSTRACT

A flash memory comprises a substrate having trenches formed therein. A tunneling oxide is formed on a surface of the substrate and adjacent to the trenches. A raised isolation fillers is formed in the trenches and protruding over an upper surface of the substrate, thereby forming a cavity between two adjacent raised isolation fillers. A floating gate is formed along a surface of the cavity to have a U-shaped structure in cross sectional view, wherein the high level of the U-shaped structure is the same with the one of the raised isolation fillers. An isolation structure is formed on the top of the raised isolation fillers and upper surface of the U-shaped structure. A dielectric layer is conformally formed on a surface of the floating gate and the isolation structure. A control gate is formed on the dielectric layer.

9 Claims, 4 Drawing Sheets

FLASH MEMORY WITH CONFORMAL FLOATING GATE AND THE METHOD OF MAKING THE SAME

The present invention relates to a semiconductor device, and more specifically, to a flash memory having high coupling ratio and the method of fabricating the nonvolatile memory.

BACKGROUND OF THE INVENTION

The semiconductor industry has been advanced to the field of Ultra Large Scale Integrated (ULSI) technologies. The fabrication of the nonvolatile memories also follows the trend of the reduction of the size of a device. The high-density nonvolatile memories can be applied as the mass storage of portable handy terminals, solid state camera and PC cards. That is because that the nonvolatile memories exhibit many advantages, such as a fast access time, low power dissipation, and robustness. Further, it can be used to replace magnetic disk memory. The nonvolatile memories include various types of devices, such as EAROM (electrically alterable read only memory), EEPROM (electrically erasable programmable read only memory), EEPROM-EAROMs and non-volatile SRAMs.

Different types of devices have been developed for specific applications requirements in each of the segments of memory. In the device, electrical alterability is achieved by Fowler-Nordheim tunneling which is cold electron tunneling through the energy barrier at a silicon-thin dielectric interface and into the oxide conduction band. Typically, the thin dielectric layer is composed of silicon dioxide and the thin silicon dioxide layer allows charges to tunnel through when a voltage is applied to the gate. These charges are trapped in the silicon dioxide and remain trapped there since the materials are high quality insulators. A conventional flash memory is a type of erasable programmable read-only memory (EPROM). One of the advantages of flash memory is its capacity for block-by-block memory erasure. Furthermore, the speed of memory erasure is fast. For other EPROM, the memory erasure can take up to several minutes due to the erase mode of such type memory is done by bit-by-bit.

Various flash memories have been disclosed in the prior art, the type of the flash includes separated-gate and stacked-gate structure. U.S. Pat. No. 6,180,454 to Chang, et al, entitled "Method for forming flash memory devices", and filed on Oct. 29, 1999. U.S. Pat. No. 5,956,268 disclosed a Nonvolatile memory structure. The prior art allows for array, block erase capabilities. U.S. Pat. No. 6,153,494 to Hsieh, et al., entitled "Method to increase the coupling ratio of word line to floating gate by lateral coupling in stacked-gate flash" and filed on Feb. 11, 1998. The object of this invention is to provide a method of forming a stacked-gate flash memory having a shallow trench isolation with a high-step in order to increase the lateral coupling between the word line and the floating gate. Hsieh disclosed a step of forming nitride layer and then forming hallow trench isolation (STI) through the nitride layer into the substrate. Then, oxide is filled into the STI, the nitride is then removed leaving behind a deep opening about the filled STI. The detailed description may refer to the prior art. A stacked-gate flash memory cell is provided having a shallow trench isolation with a high-step of oxide and high lateral coupling.

Chen disclosed a nonvolatile memory with self-aligned floating gate in U.S. Pat. No. 6,140,182 and assigned to Actrans System Inc. A further prior art can be seen in U.S. Pat. No. 6,172,396 to Chang, the prior art provides a method that is capable of eliminating buried trenches in the source/drain regions without lowering the coupling rate between the floating gate and the control gate.

SUMMARY OF THE INVENTION

The object of the present invention is to form flash memory with higher coupling ratio.

It is another object of this invention to provide a method of forming a flash memory having sidewall coupling to increase the coupling ratio between the control gate and the floating gate of the cell.

The flash memory according to the present invention comprises a substrate having trenches formed therein. A tunneling oxide is formed on a surface of the substrate and adjacent to the trenches. A raised isolation fillers is formed in the trenches and protruding over an upper surface of the substrate, thereby forming a cavity between two adjacent raised isolation fillers. A floating gate is formed along a surface of the cavity to have a U-shaped structure in cross sectional view, wherein the high level of the U-shaped structure is the same with the one of the raised isolation fillers. An isolation structure is formed on the top of the raised isolation fillers and upper surface of the U-shaped structure. A dielectric layer conformally is formed on a surface of the floating gate and the isolation structure. A control gate is formed on the dielectric layer.

A method of manufacturing a flash memory comprises forming a first dielectric layer on a semiconductor substrate and patterning the first dielectric layer, the substrate to form trenches in the substrate. First isolations is refilled into the trenches, followed by removing the first dielectric layer, thereby forming a cavity between the first isolations and the isolations protruding over the substrate. A tunneling oxide is formed on the substrate, then a first conductive layer is formed on the tunneling oxide and along a surface of the first isolation. A second dielectric layer is formed on the first conductive layer. A portion of the second dielectric layer is removed to expose the first conductive layer on the first isolation. An oxidation is performed to transform the exposed first conductive layer into second oxide, thereby separating the first conductive layer. A third dielectric layer is formed on a surface of the first conductive layer. A second conductive layer is formed on the second dielectric layer as a control gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
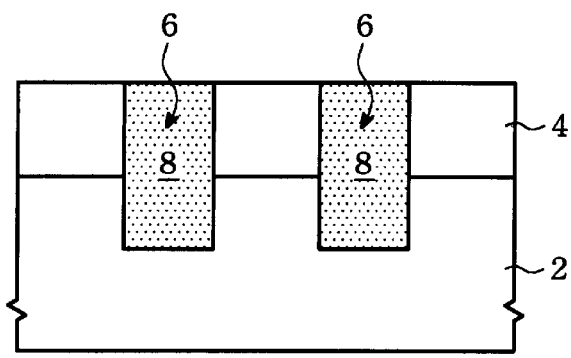
FIG. 1 is a cross section view of a semiconductor wafer illustrating the steps of forming isolation in a trench of a substrate according to the present invention.
Figure 2:
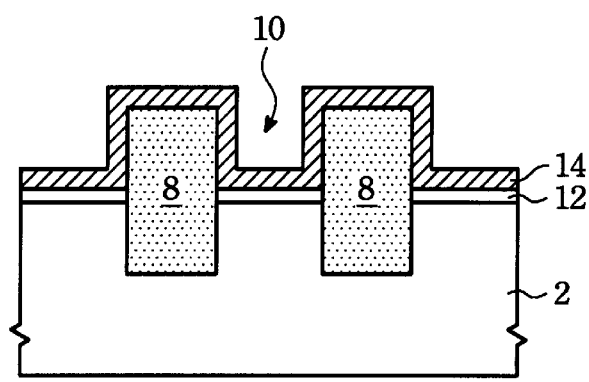
FIG. 2 is a cross section view of a semiconductor wafer illustrating the steps of forming protruding isolation, tunneling oxide, first conductive layer according to the present invention.

The present invention proposes a novel structure and method to fabricate the stacked-gate flash memory. The flash memory cell includes a trench formed in a substrate 2, please refer to FIG. 3. A tunneling oxide 4 is formed on the surface of the substrate 2 and adjacent to the trench 6. A protruding isolation (filler) 8 is formed in the trench 6 and protruding over the upper surface of the substrate, thereby forming a cavity between the adjacent protruding isolation filler 8. A floating gate 14 is formed along the surface of the cavity 14 to have a U-shaped structure in cross sectional view. The high level of the U-shaped structure is the same with the one of the protruding isolation filler 8. A dielectric layer 16 is conformally formed on the surface of the floating gate 16 and a control gate 18 is formed on the dielectric layer 16. A second embodiment may refer to FIG. 6, the alternative case includes an isolation structure lying over the protruding isolation filler 8 and the upper surface of the U-shaped structure.

The method of forming the structure is described as follows. In first method, a trench is formed and a floating gate is formed in the trench to increase the coupling ratio. The detail description of the method will be seen as follows. In a preferred embodiment, as shown in the FIG. 1, a single crystal silicon substrate 2 with a <100> or <111> crystallographic orientation is provided. A masking layer 4 such as silicon nitride layer 4 is formed on the substrate 2. Typically, The silicon nitride layer 8 is deposited by any suitable process. For example, Low Pressure Chemical Vapor Deposition (LPCVD), Plasma Enhance Chemical Vapor Deposition (PECVD), High Density Plasma Chemical Vapor Deposition (HDPCVD). In the preferred embodiment, the reaction gases of the step to form silicon nitride layer include $SiH_4$, $NH_3$, $N_2$ or $SiH_2Cl_2$, $NH_3$, $N_2$. The thickness of the masking layer 4 is about 500–3500 angstroms.

Next, as can be seen by reference to FIG. 1, a photoresist (not shown) is patterned on the masking layer 4 to define :trench region, followed by etching the masking layer and substrate 2 to form trenches 6 in the substrate 2. The photoresist is next removed by oxygen plasma ashing. Subsequently, the trench 10 is filled with isolation oxide 8, using the method of high density plasma (HDP) deposition or LPCVD. Next, the substrate 2 is subjected to chemical-mechanical polishing (CMP), thus forming shallow trench isolation (STI) 8 as shown in FIG. 1. Then, the masking layer 4 is removed by hot phosphorus acid solution, thereby forming protruding isolation filler 8 protruding over the surface the substrate 2. A cavity 10 is therefore formed between the raised isolation filler 8. The step high of the protruding isolation filler 8 can be defined by the thickness of the masking layer 4. Hence, the coupling ratio can be controlled by the present invention.

Next, tunneling oxide 12 is formed on the surface of the substrate by thermal oxidation or CVD. A conductive layer 14 such as in-situ doped polysilicon along the surface of the cavity 10 and the protruding isolation filler 8. The conductive layer 14 is chosen from doped polysilicon or in-situ doped polysilicon, silicon or amorphous silicon.

Figure 3:
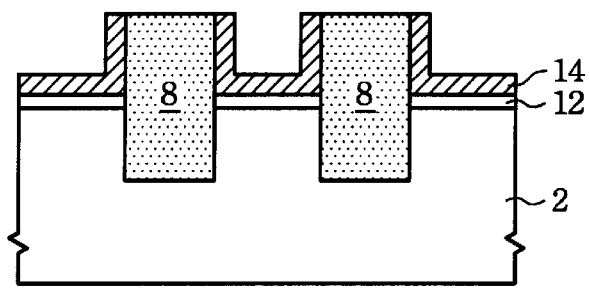
FIG. 3 is a cross section views of a semiconductor wafer illustrating the step of performing a polishing according to the present invention.

This is achieved preferably through a LPCVD method employing silane as a silicon source material at a temperature range between about 500 to 650 degree C. A chemical mechanical polishing (CMP) is employed to remove the upper surface of the conductive layer 14 to expose the surface of the protruding isolation filler 8, thereby separating each cell, as shown in FIG. 3.

The remained polysilicon layer 14 serve as a floating gate and isolated by the protruding isolation filler 8. As another key aspect of the present invention, remained thin polysilicon layer 14 is conformally formed so as to follow the contours of the cavity 10, thus providing additional surface to the control gate dielectric that is to be formed later. In another words, the polysilicon should not fill the totally the cavity 10.

Figure 4:
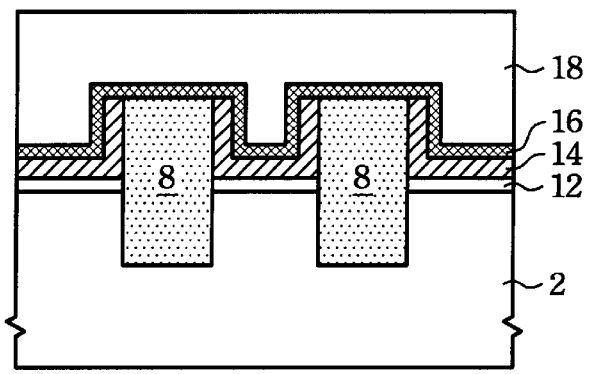
FIG. 4 is a cross section views of a semiconductor wafer illustrating the step of forming a control gate according to the present invention.

An interpoly dielectric layer 16 is next formed over the contours of the conformal floating gate and the upper surface of the protruding isolation filler 8, as shown in FIG. 4. It is preferred that the interpoly dielectric layer 16 comprises but not limited to oxide/nitride/oxide (ONO), ON. Then, a further polysilicon layer 18 is formed over the interpoly dielectric layer 16 to act as the control gate and word line. Thus, a flash is formed as shown in the cross-sectional view of FIG. 4. A further patterning may be used to define the control gate. The control gate can be chosen from polysilicon, silicon or amorphous silicon.

The higher coupling can be obtained due to the floating gate formed against the high-step oxide protruding over the isolation trench of the present invention.

Figure 5:
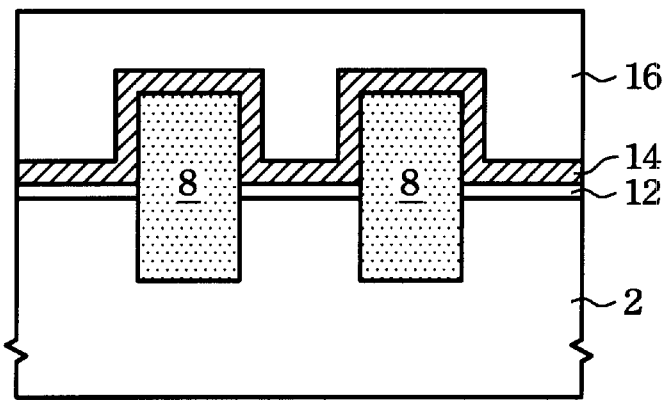
FIG. 5 is a cross section view of a semiconductor wafer illustrating the steps of forming protruding isolation, tunneling oxide, first conductive layer according to the present invention.
Figure 10:
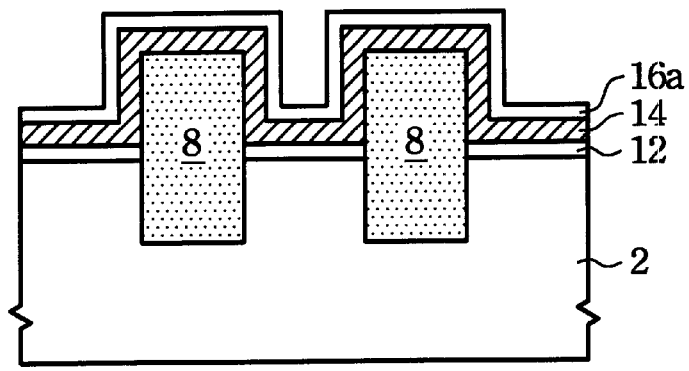

Please referring to FIG. 5, a second embodiment according to the present invention is similar to the first embodiment, any suitable dielectric layer 16 is deposited on the first conductive layer 14 after the first conductive layer 14 is formed. The material for the layer 16 can be any suitable material such as nitride, oxide or spin-on-glass. A further embodiment can be seen in FIG. 10, the dielectric layer 16a is a thin conformal oxidation resistant layer 16a that is conformally formed along the surface of underlying structure. The thickness of the first conductive layer 14 and the oxidation resistant layer 16 are respectively 100–1000 angstroms and 50–500 angstroms. The oxidation resistant layer 16 can be silicon nitride. The benefit of the thin conformal oxidation resistant layer 16a to the method is a thinner layer is needed for saving the cost.

Figure 6:
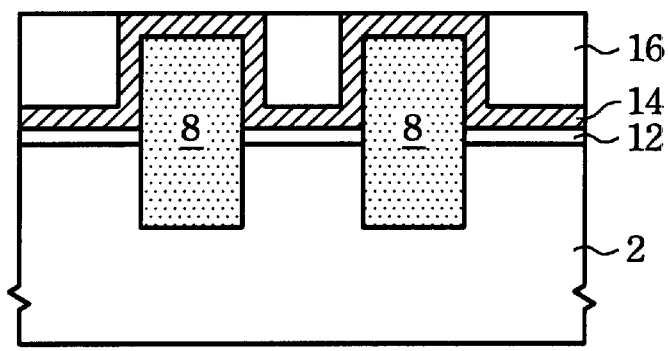
FIG. 6 is a cross section view of a semiconductor wafer illustrating the steps of removing a second dielectric layer on the first conductive layer according to the present invention.
Figure 7:
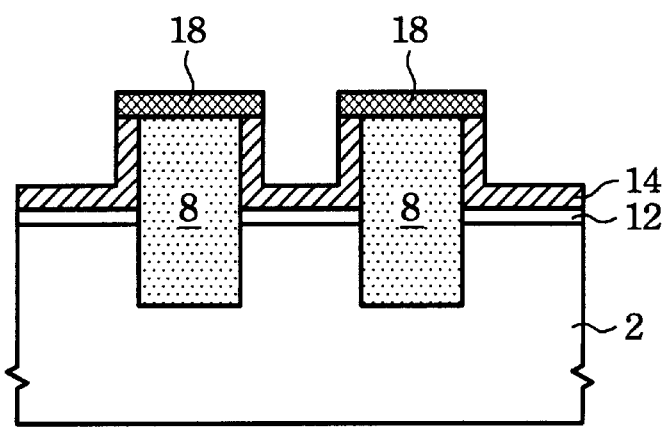
FIG. 7 is a cross section view of a semiconductor wafer illustrating the step of performing oxidation according to the present invention.
Figure 8:
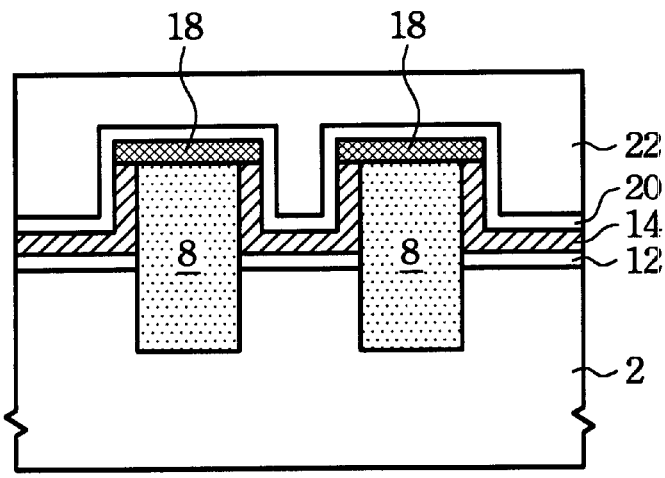
FIG. 8 is a cross section views of a semiconductor wafer illustrating the step of forming a control gate according to the present invention.
Figure 11:
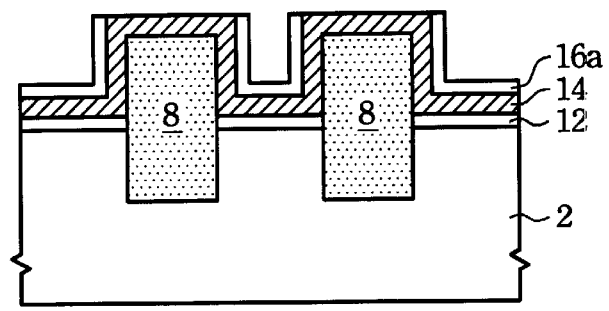
FIG. 11 is a cross section view of a semiconductor wafer illustrating the steps of removing a thin second dielectric layer on the first conductive layer according to the present invention.
Figure 12:
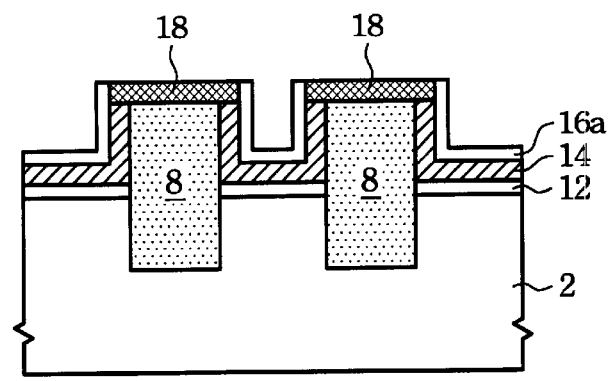
FIG. 12 is a cross section view of a semiconductor wafer illustrating the step of performing oxidation according to the present invention.
Figure 13:
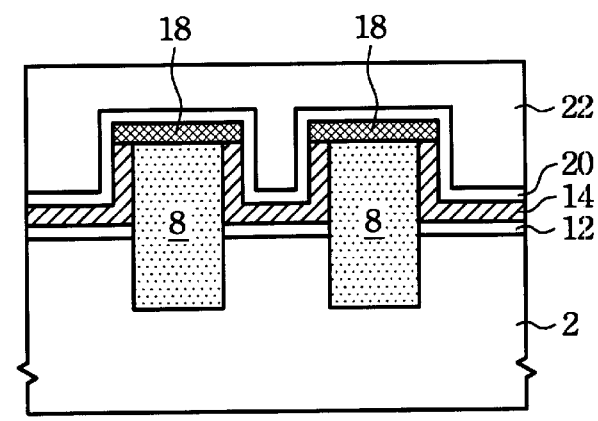
FIG. 13 is a cross section view of a semiconductor wafer illustrating the steps of forming dielectric and control gate according to the present invention.

Turning to FIG. 6 and FIG. 11, a CMP is introduced to polish the dielectric layer 16 or the oxidation resistant layer 16a to expose the portion of the first conductive layer 14 lying on the protruding isolation 8. An oxidation is performed in oxygen ambient to oxidize the first conductive layer 14 into oxide. Preferably, the first conductive layer 14 is formed of polysilicon. It has to be noted that the step may separate the polysiliocn layer and define the floating gate by maskless step as shown in FIG. 8 and FIG. 12. Then, the dielectric layer 16 or the oxidation resistant layer 16a is removed. The following sequences are similar to the aforementioned embodiment to deposit the ONO 20 and the control gate 22.

Figure 9:
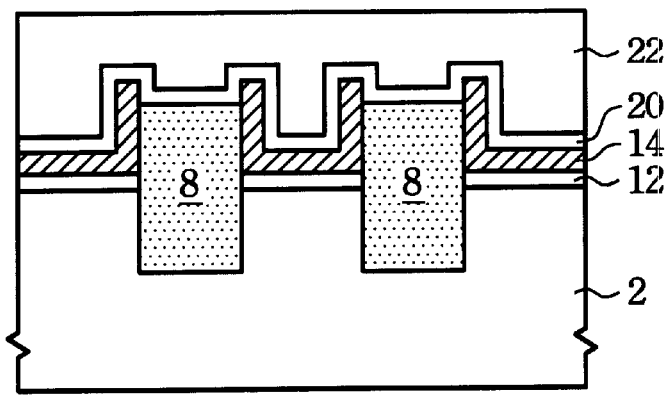
FIGS. 9–10 are a cross section views of a semiconductor wafer illustrating an alternative embodiment according to the present invention.
Figure 14:
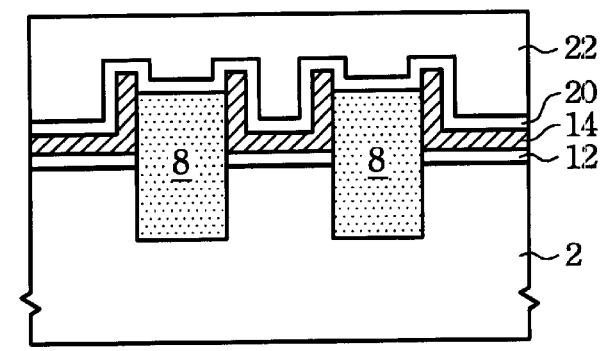
FIG. 14 is a cross section view of a semiconductor wafer illustrating the steps of forming dielectric and control gate after the removal of the oxide structure according to the present invention.

Another embodiment according to the present invention is to remove the oxide 18 prior to forming the ONO 20 and control gate 22. The results are respectively formed in FIG. 9 and FIG. 14. The protruding oxide 8 is recessed due to the removal of the oxide 18, thereby increasing the sidewall surface. Thus, under such structure, the protruding oxide 8 is protruding over the substrate and the U-shaped floating gate 14 is also protruding over the protruding oxide 8, as shown in FIG. 14, 9. The coupling ratio may be increased by the structure.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method of manufacturing a flash memory, comprising:
    forming a first dielectric layer on a semiconductor substrate;
    patterning said first dielectric layer, said substrate to form trenches in said substrate;
    forming first isolations into said trenches;
    removing said first dielectric layer, thereby forming a cavity between said first isolations and said first isolations protruding over said substrate;
    forming a tunneling oxide on said substrate;
    forming a first conductive layer on said tunneling oxide and along a surface of said first isolation;
    forming a second dielectric layer on said first conductive layer;
    removing a portion of said second dielectric layer to expose said first conductive layer on said first isolation;
    performing an oxidation to transform said exposed first conductive layer into second isolation, thereby separating said first conductive layer;
    removing said second dielectric layer;
    forming a third dielectric layer on a surface of said first conductive layer; and
    forming a second conductive layer on said third dielectric layer as a control gate.

2. The method of claim 1, wherein said second dielectric layer includes oxide, nitride or SOG.

3. The method of claim 1, wherein said second dielectric layer includes oxidation resistant layer that is conformally formed on said first conductive layer.

4. The method of claim 1, further comprising removing said second isolation while removing said second dielectric layer.

5. The method of claim 1, wherein said first dielectric layer comprises nitride.

6. The method of claim 5, wherein said first dielectric layer is removed by hot phosphorus acid solution.

7. The method of claim 1, wherein said first conductive layer is removed by chemical mechanical polishing.

8. The method of claim 1, wherein said third dielectric layer comprises oxide/nitride.

9. The method of claim 1, wherein said third dielectric layer comprises oxide/nitride/oxide.

* * * * *